United States Patent
Youn

(10) Patent No.: US 7,113,646 B2
(45) Date of Patent: *Sep. 26, 2006

(54) DECODING OF PREDICTED AC COEFFICIENT WITHOUT DIVISION

(75) Inventor: Jeongnam Youn, San Jose, CA (US)

(73) Assignee: Equator Technologies, Inc., Campbell, CA (US)

( * ) Notice: Subject to any disclaimer, the term of this patent is extended or adjusted under 35 U.S.C. 154(b) by 771 days.

This patent is subject to a terminal disclaimer.

(21) Appl. No.: 10/187,262

(22) Filed: Jun. 28, 2002

(65) Prior Publication Data

US 2003/0035587 A1 Feb. 20, 2003

Related U.S. Application Data

(60) Provisional application No. 60/301,866, filed on Jun. 29, 2001.

(51) Int. Cl.
*G06K 9/36* (2006.01)

(52) U.S. Cl. ........................ 382/251; 382/233; 382/238
(58) Field of Classification Search ................ 382/233, 382/238, 251, 240, 264, 266; 375/240.03, 375/240.11
See application file for complete search history.

(56) References Cited

U.S. PATENT DOCUMENTS

| | | | | |
|---|---|---|---|---|
| 6,141,446 A | * | 10/2000 | Boliek et al. | ................ 382/233 |
| 6,754,394 B1 | * | 6/2004 | Boliek et al. | ................ 382/240 |
| 6,882,685 B1 | * | 4/2005 | Malvar | .................. 375/240.03 |

\* cited by examiner

*Primary Examiner*—Anh Hong Do
(74) *Attorney, Agent, or Firm*—Marger Johnson & McCollom, P.C.

(57) ABSTRACT

A technique for eliminating the division in decoding a predicted AC coefficient includes calculating and storing the values of I//AC_stepsize in a table. This allows one to convert a division into a multiplication.

13 Claims, 13 Drawing Sheets

DECODING OF PREDICTED AC COEFFICIENT WITHOUT DIVISION

This application claims the benefit of Provisional application Ser. No. 60/301,866, filed Jun. 29, 2001.

BACKGROUND

General Overview of Conventional Image-compression Techniques

To help the reader more easily understand the concepts discussed below in the description of the invention, following is a basic overview of conventional image-compression techniques.

To electronically transmit a relatively high-resolution image over a relatively low-band-width channel, or to electronically store such an image in a relatively small memory space, it is often necessary to compress the digital data that represents the image. Such image compression typically involves reducing the number of data bits necessary to represent an image. For example, High-Definition-Television (HDTV) video images are compressed to allow their transmission over existing television channels. Without compression, HDTV video images would require transmission channels having bandwidths much greater than the bandwidths of existing television channels. Furthermore, to reduce data traffic and transmission time to acceptable levels, an image may be compressed before being sent over the internet. Or, to increase the image-storage capacity of a CD-ROM or server, an image may be compressed before being stored thereon.

Referring to FIGS. 1A–7, the basics of the popular block-based Moving Pictures Experts Group (MPEG) compression standards, which include MPEG-1, MPEG-2, and MPEG-4 are discussed. For purposes of illustration, the discussion is based on using an MPEG 4:2:0 format to compress video images represented in a Y, $C_B$, $C_R$ color space. However, the discussed concepts also apply to other MPEG formats, to images that are represented in other color spaces, and to other block-based compression standards such as the Joint Photographic Experts Group (JPEG) standard, which is often used to compress still images. Furthermore, although many details of the MPEG standards and the Y, $C_B$, $C_R$ color space are omitted for brevity, these details are well known and are disclosed in a large number of available references.

Still referring to FIGS. 1A–7, the MPEG standards are often used to compress temporal sequences of images—video frames for purposes of this discussion—such as those found in a television broadcast. Each video frame is divided into subregions called macro blocks, which each include one or more pixels. FIG. 1A is a 16-pixel-by-16-pixel macro block 30 having 256 pixels 32 (not drawn to scale). In the MPEG standards, a macro block is typically 16×16 pixels, although other compression standards may use macro blocks having other dimensions. In the original video frame, i.e., the frame before compression, each pixel 32 has a respective luminance value Y and a respective pair of color—, i.e., chroma—, difference values $C_B$ and $C_R$.

Referring to FIGS. 1A–1D, before compression of the frame, the digital luminance (Y) and chroma-difference ($C_B$ and $C_R$) values that will be used for compression, i.e., the pre-compression values, are generated from the original Y, $C_B$, and $C_R$ values of the original frame. In the MPEG 4:2:0 format, the pre-compression Y values are the same as the original Y values. Thus, each pixel 32 merely retains its original luminance value Y. But to reduce the amount of data to be compressed, the MPEG 4:2:0 format allows only one pre-compression $C_B$ value and one pre-compression $C_R$ value for each group 34 of four pixels 32. Each of these pre-compression $C_B$ and $C_R$ values are respectively derived from the original $C_B$ and $C_R$ values of the four pixels 32 in the respective group 34. For example, a pre-compression $C_B$ value may equal the average of the original $C_B$ values of the four pixels 32 in the respective group 34. Thus, referring to FIGS. 1B–1D, the pre-compression Y, $C_B$, and $C_R$ values generated for a macro block are arranged as one 16×16 matrix 36 of pre-compression Y values (equal to the original Y values for each respective pixel 32), one 8×8 matrix 38 of pre-compression $C_B$ values (equal to one derived $C_B$ value for each group 34 of four pixels 32), and one 8×8 matrix 40 of pre-compression $C_R$ values (equal to one derived $C_R$ value for each group 34 of four pixels 32). The matrices 36, 38, and 40 are often called "blocks" of values. Furthermore, because it is convenient to perform the compression transforms on 8×8 blocks of pixel values instead of on 16×16 blocks, the block 36 of pre-compression Y values is subdivided into four 8×8 blocks 42a–42d, which respectively correspond to the 8×8 blocks A–D of pixels in the macro block 30. Thus, referring to FIGS. 1A–1D, six 8×8 blocks of pre-compression pixel data are generated for each macro block 30: four 8×8 blocks 42a–42d of pre-compression Y values, one 8×8 block 38 of pre-compression $C_B$ values, and one 8×8 block 40 of pre-compression $C_R$ values.

FIG. 2 is a block diagram of an MPEG compressor 50, which is more commonly called an encoder. Generally, the encoder 50 converts the pre-compression data for a frame or sequence of frames into encoded data that represent the same frame or frames with significantly fewer data bits than the pre-compression data. To perform this conversion, the encoder 50 reduces or eliminates redundancies in the pre-compression data and reformats the remaining data using efficient transform and coding techniques.

More specifically, the encoder 50 includes a frame-reorder buffer 52, which receives the pre-compression data for a sequence of one or more frames and reorders the frames in an appropriate sequence for encoding. Thus, the reordered sequence is often different than the sequence in which the frames are generated and will be displayed. The encoder 50 assigns each of the stored frames to a respective group, called a Group Of Pictures (GOP), and labels each frame as either an intra (I) frame or a non-intra (non-I) frame. For example, each GOP may include three I frames and twelve non-I frames for a total of fifteen frames. The encoder 50 always encodes an I frame without reference to another frame, but can and often does encode a non-I frame with reference to one or more of the other frames in the GOP. The encoder 50 does not, however, encode a non-I frame with reference to a frame in a different GOP.

Referring to FIGS. 2 and 3, during the encoding of an I frame, the 8×8 blocks (FIGS. 1B–1D) of the pre-compression Y, $C_B$, and $C_R$ values that represent the I frame pass through a summer 54 to a Discrete Cosine Transformer (DCT) 56, which transforms these blocks of values into respective 8×8 blocks of one DC (zero frequency) transform value and sixty-three AC (non-zero frequency) transform values. FIG. 3 is a block 57 of luminance transform values Y-DCT$_{(0,\ 0)a}$–Y-DCT$_{(7,\ 7)a}$, which correspond to the pre-compression luminance pixel values Y$_{(0,\ 0)a}$–Y$_{(7,\ 7)a}$ in the block 36 of FIG. 1B. Thus, the block 57 has the same number of luminance transform values Y-DCT as the block 36 has of luminance pixel values Y. Likewise, blocks of chroma transform values $C_B$-DCT and $C_R$-DCT (not shown)

correspond to the chroma pixel values in the blocks 38 and 40. Furthermore, the pre-compression Y, $C_B$, and $C_R$ values pass through the summer 54 without being summed with any other values because the summer 54 is not needed when the encoder 50 encodes an I frame. As discussed below, however, the summer 54 is often needed when the encoder 50 encodes a non-I frame.

Referring to FIG. 2 and FIG. 4, a quantizer and zigzag scanner 58 limits each of the transform values from the DCT 56 to a respective maximum value, and provides the quantized AC and DC transform values on respective paths 60 and 62. FIG. 4 is an example of a zigzag scan pattern 63, which the quantizer and zigzag scanner 58 may implement. Specifically, the quantizer and scanner 58 reads the transform values in the transform block (such as the transform block 57 of FIG. 3) in the order indicated. Thus, the quantizer and scanner 58 reads the transform value in the "0" position first, the transform value in the "1" position second, the transform value in the "2" position third, and so on until it reads the transform value in the "63" position last. The quantizer and zigzag scanner 58 reads the transform values in this zigzag pattern to increase the coding efficiency as is known. Of course, depending upon the coding technique and the type of images being encoded, the quantizer and zigzag scanner 58 may implement other scan patterns too.

Referring again to FIG. 2, a prediction encoder 64 predictively encodes the DC transform values, and a variable-length coder 66 converts the quantized AC transform values and the quantized and predictively encoded DC transform values into variable-length codes such as Huffman codes. These codes form the encoded data that represent the pixel values of the encoded I frame. A transmit buffer 68 then temporarily stores these codes to allow synchronized transmission of the encoded data to a decoder (discussed below in conjunction with FIG. 6). Alternatively, if the encoded data is to be stored instead of transmitted, the coder 66 may provide the variable-length codes directly to a storage medium such as a CD-ROM.

If the I frame will be used as a reference (as it often will be) for one or more non-I frames in the GOP, then, for the following reasons, the encoder 50 generates a corresponding reference frame by decoding the encoded I frame with a decoding technique that is similar or identical to the decoding technique used by the decoder (FIG. 6). When decoding non-I frames that are referenced to the I frame, the decoder has no option but to use the decoded I frame as a reference frame. Because MPEG encoding and decoding are lossy—some information is lost due to quantization of the AC and DC transform values—the pixel values of the decoded I frame will often be different than the pre-compression pixel values of the original I frame. Therefore, using the pre-compression I frame as a reference frame during encoding may cause additional artifacts in the decoded non-I frame because the reference frame used for decoding (decoded I frame) would be different than the reference frame used for encoding (pre-compression I frame).

Therefore, to generate a reference frame for the encoder that will be similar to or the same as the reference frame for the decoder, the encoder 50 includes a dequantizer and inverse zigzag scanner 70, and an inverse DCT 72, which are designed to mimic the dequantizer and scanner and the inverse DCT of the decoder (FIG. 6). The dequantizer and inverse scanner 70 first implements an inverse of the zigzag scan path implemented by the quantizer 58 such that the DCT values are properly located within respective decoded transform blocks. Next, the dequantizer and inverse scanner 70 dequantizes the quantized DCT values, and the inverse DCT 72 transforms these dequantized DCT values into corresponding 8×8 blocks of decoded Y, $C_B$, and $C_R$ pixel values, which together compose the reference frame. Because of the losses incurred during quantization, however, some or all of these decoded pixel values may be different than their corresponding pre-compression pixel values, and thus the reference frame may be different than its corresponding pre-compression frame as discussed above. The decoded pixel values then pass through a summer 74 (used when generating a reference frame from a non-I frame as discussed below) to a reference-frame buffer 76, which stores the reference frame.

During the encoding of a non-I frame, the encoder 50 initially encodes each macro-block of the non-I frame in at least two ways: in the manner discussed above for I frames, and using motion prediction, which is discussed below. The encoder 50 then saves and transmits the resulting code having the fewest bits. This technique insures that the macro blocks of the non-I frames are encoded using the fewest bits.

With respect to motion prediction, an object in a frame exhibits motion if its relative position changes in the preceding or succeeding frames. For example, a horse exhibits relative motion if it gallops across the screen. Or, if the camera follows the horse, then the background exhibits relative motion with respect to the horse. Generally, each of the succeeding frames in which the object appears contains at least some of the same macro blocks of pixels as the preceding frames. But such matching macro blocks in a succeeding frame often occupy respective frame locations that are different than the respective frame locations they occupy in the preceding frames. Alternatively, a macro block that includes a portion of a stationary object (e.g., tree) or background scene (e.g., sky) may occupy the same frame location in each of a succession of frames, and thus exhibit "zero motion". In either case, instead of encoding each frame independently, it often takes fewer data bits to tell the decoder "the macro blocks R and Z of frame 1 (non-I frame) are the same as the macro blocks that are in the locations S and T, respectively, of frame 0 (reference frame)." This "statement" is encoded as a motion vector. For a relatively fast moving object, the location values of the motion vectors are relatively large. Conversely, for a stationary or relatively slow-moving object or background scene, the location values of the motion vectors are relatively small or equal to zero.

FIG. 5 illustrates the concept of motion vectors with reference to the non-I frame 1 and the reference frame 0 discussed above. A motion vector $MV_R$ indicates that a match for the macro block in the location R of frame 1 can be found in the location S of a reference frame 0. $MV_R$ has three components. The first component, here 0, indicates the frame (here frame 0) in which the matching macro block can be found. The next two components, $X_R$ and $Y_R$, together comprise the two-dimensional location value that indicates where in the frame 0 the matching macro block is located. Thus, in this example, because the location S of the frame 0 has the same X-Y coordinates as the location R in the frame 1, $X_R=Y_R=0$. Conversely, the macro block in the location T matches the macro block in the location Z, which has different X-Y coordinates than the location T. Therefore, $X_z$ and $Y_z$ represent the location T with respect to the location Z. For example, suppose that the location T is ten pixels to the left of (negative X direction) and seven pixels down from (negative Y direction) the location Z. Therefore, $MV_z=(0, -10, -7)$. Although there are many other motion-vector schemes available, they are all based on the same general concept. For example, the locations R may be bidirectionally encoded. That is, the location R may have two motion vectors that point to respective matching locations in different frames, one preceding and the other succeeding the frame 1. During decoding, the pixel values of these matching locations are averaged or otherwise combined to calculate the pixel values of the location.

Referring again to FIG. 2, motion prediction is now discussed in detail. During the encoding of a non-I frame, a motion predictor 78 compares the pre-compression Y values—the $C_B$ and $C_R$ values are not used during motion prediction—of the macro blocks in the non-I frame to the decoded Y values of the respective macro blocks in the reference I frame and identifies matching macro blocks. For each macro block in the non-I frame for which a match is found in the I reference frame, the motion predictor 78 generates a motion vector that identifies the reference frame and the location of the matching macro block within the reference frame. Thus, as discussed below in conjunction with FIG. 6, during decoding of these motion-encoded macro blocks of the non-I frame, the decoder uses the motion vectors to obtain the pixel values of the motion-encoded macro blocks from the matching macro blocks in the reference frame. The prediction encoder 64 predictively encodes the motion vectors, and the coder 66 generates respective codes for the encoded motion vectors and provides these codes to the transmit buffer 68.

Furthermore, because a macro block in the non-I frame and a matching macro block in the reference I frame are often similar but not identical, the encoder 50 encodes these differences along with the motion vector so that the decoder can account for them. More specifically, the motion predictor 78 provides the decoded Y values of the matching macro block of the reference frame to the summer 54, which effectively subtracts, on a pixel-by-pixel basis, these Y values from the pre-compression Y values of the matching macro block of the non-I frame. These differences, which are called residuals, are arranged in 8×8 blocks and are processed by the DCT 56, the quantizer and scanner 58, the coder 66, and the buffer 68 in a manner similar to that discussed above, except that the quantized DC transform values of the residual blocks are coupled directly to the coder 66 via the line 60, and thus are not predictively encoded by the prediction encoder 64.

In addition, it is possible to use a non-I frame as a reference frame. When a non-I frame will be used as a reference frame, the quantized residuals from the quantizer and zigzag scanner 58 are respectively dequantized, reordered, and inverse transformed by the dequantizer and inverse scanner 70 and the inverse DCT 72, respectively, so that this non-I reference frame will be the same as the one used by the decoder for the reasons discussed above. The motion predictor 78 provides to the summer 74 the decoded Y values of the reference frame from which the residuals were generated. The summer 74 adds the respective residuals from the inverse DCT 72 to these decoded Y values of the reference frame to generate the respective Y values of the non-I reference frame. The reference-frame buffer 76 then stores the reference non-I frame along with the reference I frame for use in motion encoding subsequent non-I frames.

Although the circuits 58 and 70 are described as performing the zigzag and inverse zigzag scans, respectively, in other embodiments, another circuit may perform the zigzag scan and the inverse zigzag scan may be omitted. For example, the coder 66 can perform the zigzag scan and the circuit 58 can perform the quantization only. Because the zigzag scan is outside of the reference-frame loop, the dequantizer 70 can omit the inverse zigzag scan. This saves processing power and processing time.

Still referring to FIG. 2, the encoder 50 also includes a rate controller 80 to insure that the transmit buffer 68, which typically transmits the encoded frame data at a fixed rate, never overflows or empties, i.e., underflows. If either of these conditions occurs, errors may be introduced into the encoded data stream. For example, if the buffer 68 overflows, data from the coder 66 is lost. Thus, the rate controller 80 uses feed back to adjust the quantization scaling factors used by the quantizer/scanner 58 based on the degree of fullness of the transmit buffer 68. Specifically, the fuller the buffer 68, the larger the controller 80 makes the scale factors, and the fewer data bits the coder 66 generates. Conversely, the more empty the buffer 68, the smaller the controller 80 makes the scale factors, and the more data bits the coder 66 generates. This continuous adjustment insures that the buffer 68 neither overflows or underflows.

FIG. 6 is a block diagram of a conventional MPEG decompresser 82, which is commonly called a decoder and which can decode frames that are encoded by the encoder 50 of FIG. 2.

Referring to FIGS. 6 and 7, for I frames and macro blocks of non-I frames that are not motion predicted, a variable-length decoder 84 decodes the variable-length codes received from the encoder 50. A prediction decoder 86 decodes the predictively decoded DC transform values, and a dequantizer and inverse zigzag scanner 87, which is similar or identical to the dequantizer and inverse zigzag scanner 70 of FIG. 2, dequantizes and rearranges the decoded AC and DC transform values. Alternatively, another circuit such as the decoder 84 can perform the inverse zigzag scan. An inverse DCT 88, which is similar or identical to the inverse DCT 72 of FIG. 2, transforms the dequantized transform values into pixel values. For example, FIG. 7 is a block 89 of luminance inverse-transform values Y-IDCT, i.e., decoded luminance pixel values, which respectively correspond to the luminance transform values Y-DCT in the block 57 of FIG. 3 and to the pre-compression luminance pixel values $Y_a$ of the block 42a of FIG. 1B. But because of losses due to the quantization and dequantization respectively implemented by the encoder 50 (FIG. 2) and the decoder 82 (FIG. 6), the decoded pixel values in the block 89 are often different than the respective pixel values in the block 42a.

Still referring to FIG. 6, the decoded pixel values from the inverse DCT 88 pass through a summer 90—which is used during the decoding of motion-predicted macro blocks of non-I frames as discussed below—into a frame-reorder buffer 92, which stores the decoded frames and arranges them in a proper order for display on a video display unit 94. If a decoded frame is used as a reference frame, it is also stored in the reference-frame buffer 96.

For motion-predicted macro blocks of non-I frames, the decoder 84, dequantizer and inverse scanner 87, and inverse DCT 88 process the residual transform values as discussed above for the transform values of the I frames. The prediction decoder 86 decodes the motion vectors, and a motion interpolator 98 provides to the summer 90 the pixel values from the reference-frame macro blocks to which the motion vectors point. The summer 90 adds these reference pixel values to the residual pixel values to generate the pixel values of the decoded macro blocks, and provides these decoded pixel values to the frame-reorder buffer 92. If the encoder 50 (FIG. 2) uses a decoded non-I frame as a reference frame, then this decoded non-I frame is stored in the reference-frame buffer 96.

Referring to FIGS. 2 and 6, although described as including multiple functional circuit blocks, the encoder 50 and the decoder 82 may be implemented in hardware, software, or a combination of both. For example, the encoder 50 and the decoder 82 are often implemented by a respective one or more processors that perform the respective functions of the circuit blocks.

More detailed discussions of the MPEG encoder 50 and the MPEG decoder 82 of FIGS. 2 and 6, respectively, and of the MPEG standard in general are available in many publications including "Video Compression Demystified" by Peter D. Symes, McGraw-Hill, 2001, which is incorporated by reference. Furthermore, there are other well-known block-based compression techniques for encoding and decoding both video and still images.

DC Prediction in MPEG-4

Referring to FIG. 8, a macro block 100 typically includes four 8×8 luminance blocks 102A–102D. The macro block 100 also includes two or more 8×8 chrominance blocks that are omitted for clarity. Each macro block 100 is either an intra (I) or inter (P) macro block. An I macro block is not encoded/decoded using motion prediction, but may have coefficients that are DC/AC predicted with respect to another macroblock. Conversely, a P macroblock block is motion predicted. A P frame can have I macro blocks within it, but an I frame has no P macro blocks within it.

The first coefficient of each block 102A–102D is a DC (zero frequency) coefficient, and the next 63 coefficients are AC (non-zero frequency) coefficients. For example, the first coefficient $DC_A$ of the block 102A is a DC coefficient.

To compress the encoded bit stream that represents the frame that includes the macroblock 100, the DC coefficients of all I macro blocks (except the three upper-left-hand 8×8 blocks of the upper-left-hand macro block (not shown) of the frame) are prediction encoded. That is, each of the DC coefficients, such as $DC_A$, of an I macro block are encoded as a residual value that equals the difference between the DC coefficient and either the DC coefficient from the block to the left or from the block to the top. For example, $\overline{DC_A}$, which is the residual for $DC_A$, equals $(DC_A-DC_B) // QP_{102A}$ (vertical prediction) or $(DC_A-DC_C) // QP_{102A}$ (horizontal prediction), where $PQ_{102A}$ is the quantization factor for the block 102A.

How one determines whether to use $DC_B$ (vertical prediction) or $DC_C$ (horizontal prediction) to predict $DC_A$ is discussed below.

The // operator is a special rounding-division operator defined by the MPEG-4 standard. Basically, if the value of $DC_B \div QP_{103B}$ is positive, the // operator rounds the result to the nearest integer value. For example if $DC_B=13$ and $QP_{103B}=3$, $13\div3=4.333$, and $13 // 3=4$. If the result had been 4.5 or greater, // would round the result up to 5. For negative numbers, any number between and including −4.0 to −4.5 would round up to −4; any number less than −4.5 and greater than or equal to −5.0 would round down to −5.

The decoding, i.e., inverse prediction, of the DC coefficients such as $DC_A$ is done before the decoded coefficients in the block such as 2A are inverse quantized, i.e., multiplied by the quantization parameter for the macro block 100. Therefore, the desired predicted value of $DC_A$ is given by the following equation, where, for example purposes, we assume that vertical prediction has been used:

$$DC_A(\text{not inverse quantized}) = \overline{DC_A} + DC_B // QP_{3B} \quad (1)$$

$\overline{DC_A}$ is the decoded-but-not-inverse-quantized residual DC-coefficient value from the encoded MPEG-4 bit stream, and $QP_{103B}$ is the quantization parameter of the block 103B. Rounding division (//) of $DC_B$ by $QP_{103B}$ is necessary because $DC_B$ was previously inverse quantized, and thus must be requantized so that it has the same units—quantized units—as $DC_A$, which has not yet been inverse quantized, i.e., not yet multiplied by $QP_{102A}$ (the quantization parameter of the block 102A).

One problem with the // operator is that calculating the result using a standard division operation followed by a standard rounding operation is time consuming in terms of the number of processor cycles required.

DC Scalar

The quantization parameter QP (such as $QP_{103B}$ in equation (1)) for each block is actually a pointer to a DC scalar, which can have more bits than QP. Because QP is transmitted in the encoded bit stream, it is desired that QP have as few bits as possible.

More specifically, the MPEG-4 standard defines QP as having a value from 1 to 31, and thus as being 5 bits long. The value of QP and the DC scalar for luminance and chrominance values are related according to Table I.

TABLE I

| | QP | 1–4 | 5–8 | 9–25 | 26–31 |
|---|---|---|---|---|---|
| luminance | DC Scalar | 8 | 2 × QP | QP + 8 | 2 × QP − 16 |
| chrominance | DC Scaler | 8 | (QP + 13)/2 | | QP − 6 |

Range Of Values For The DC Coefficients

Each DC coefficient (such as $DC_A$) has a value ranging from −2048 to +2047 before it is inverse quantized, i.e., multiplied by the DC scalar. The value of the inverse-quantized (i.e., post multiplication by DC scalar) DC coefficient is in the range $(44 \times (-2048))$ to $(44 \times (+2047))$.

AC Prediction

FIG. 9 shows the DC coefficients and two rows and two columns of AC coefficients for the 8×8 blocks 102A, 103B, and 103C of FIG. 8. As discussed above in conjunction with FIG. 8, each of these blocks has a total of 64 coefficients, a DC coefficient in the upper left-hand corner and 63 AC coefficients. For I macro blocks, the AC coefficients are prediction encoded and decoded in a manner similar to that described above for DC prediction. But as discussed in more detail below, one difference between AC and DC prediction is that AC prediction is done post inverse quantization. That is, AC prediction is done after the decoded, quantized AC coefficients in the surrounding blocks as well as the quantized AC prediction values in the block being processed have been multiplied by the step-sized quantization parameter $Q_{PAC}$, which is discussed below.

Still referring to FIG. 9, each of the AC coefficients is predicted either vertically or horizontally (in the same direction as the DC prediction) with the same element in the corresponding block. For example, assume that the AC coefficients in the block 102A are vertically predicted from the AC coefficients in the block 103B. In this case, AC coefficient $AC_{102A1}$ in the block 102A is predicted from $AC_{103B1}$ in the block 103B, and so on, according to the following equation:

$$QF_{102A}[i] = P_{redict}QF_{102A}[i] + (QF_{103B}[i] \times QP_{103B}) // QP_{102A} \quad (2)$$

where $QF_{102A}[i]$ is the inverse-quantized AC coefficient for element i of the block 102A, $P_{redict}QF_{102A}[i]$ is the quantized AC prediction value for the element i, $QF_{103B}[i]$ is the quantized AC coefficient for the element i of the block 103B, $QP_{103B}$ is the AC quantization parameter for the block 103B, and $QP_{102A}$ is the AC quantization parameter for the block 102A. During encoding of the block 102A, Prediction Value, the precursor of $P_{redict}QF_{102A}[i]$, is calculated according to the following equation:

$$P_{redict}QF_{102A}[i] - QF_{103B}[i]/QP_{103B} = \text{Prediction Value} \quad (3)$$

During decoding of the block 102A but before application of equation (2), $QF_{102A}[i]/QP_{102A}$ and Prediction Value are multiplied by $QP_{102A}$ (i.e., are inverse quantized) to give $QF_{102A}[i]$ and $P_{redict}QF_{102A}[i] = QP_{102A} \times \text{Prediction Value}$, and $QF_{103B}[i]/QP_{103B}$ is multiplied by $QP_{103B}$ (i.e., inverse quantized) to give $QF_{103B}[i]$. Substituting these values in equation (3) and rearranging the values gives the following equation:

$$(QF_{102A}[i]/QP_{102A}) \times QP_{102A} = (\text{Prediction Value}) \times QP_{102A} + (QF_{103B}[i]/QP_{103B}) \times QP_{102A} \quad (4)$$

Because $QF_{102A}[i]$, $P_{redict}QF_{102A}[i]$, and $QF_{103B}$ are already available, we multiply $QF_{103B}$ by $QP_{102A}$ and round divide (//) by $QP_{103B}$, which gives equation (2).

Again, because the MPEG-4 defined rounding division // operator is complicated and requires many processor clock cycles, it would be desirable to eliminate this division from equation (2) to simplify and speed up the block decoding process.

AC Step-sized Value

As discussed above for the DC quantization parameter QP, the AC quantization parameter QP is a pointer to a step-sized value that is used in the equations (2)–(4) in place of $QP_{102A}$ and $QP_{103B}$.

More specifically, The AC QP is a 5-bit number having a value from 1 to 31, and the AC step-sized value to which QP points equals 2×QP for all values of QP.

Range Of Inverse-quantized AC Coefficient Values

The range of the inverse-quantized AC coefficients QF in equations (2)–(4) is −2048 to +2047.

SUMMARY OF THE INVENTION

In one aspect of the invention, all possible values for the inverse of the denominator in an equation used for AC prediction in MPEG-4 are precalculated and stored in a look-up table so that instead of performing a division each time an AC coefficient is decoded, the appropriate value for the inverse of the denominator is obtained from the look-up table, thus avoiding the division.

DESCRIPTION OF THE EMBODIMENTS OF THE INVENTION

The following discussion is presented to enable one skilled in the art to make and use the invention. Various modifications to the disclosed embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

DC Prediction Without Division

Figures 1A, 1B:
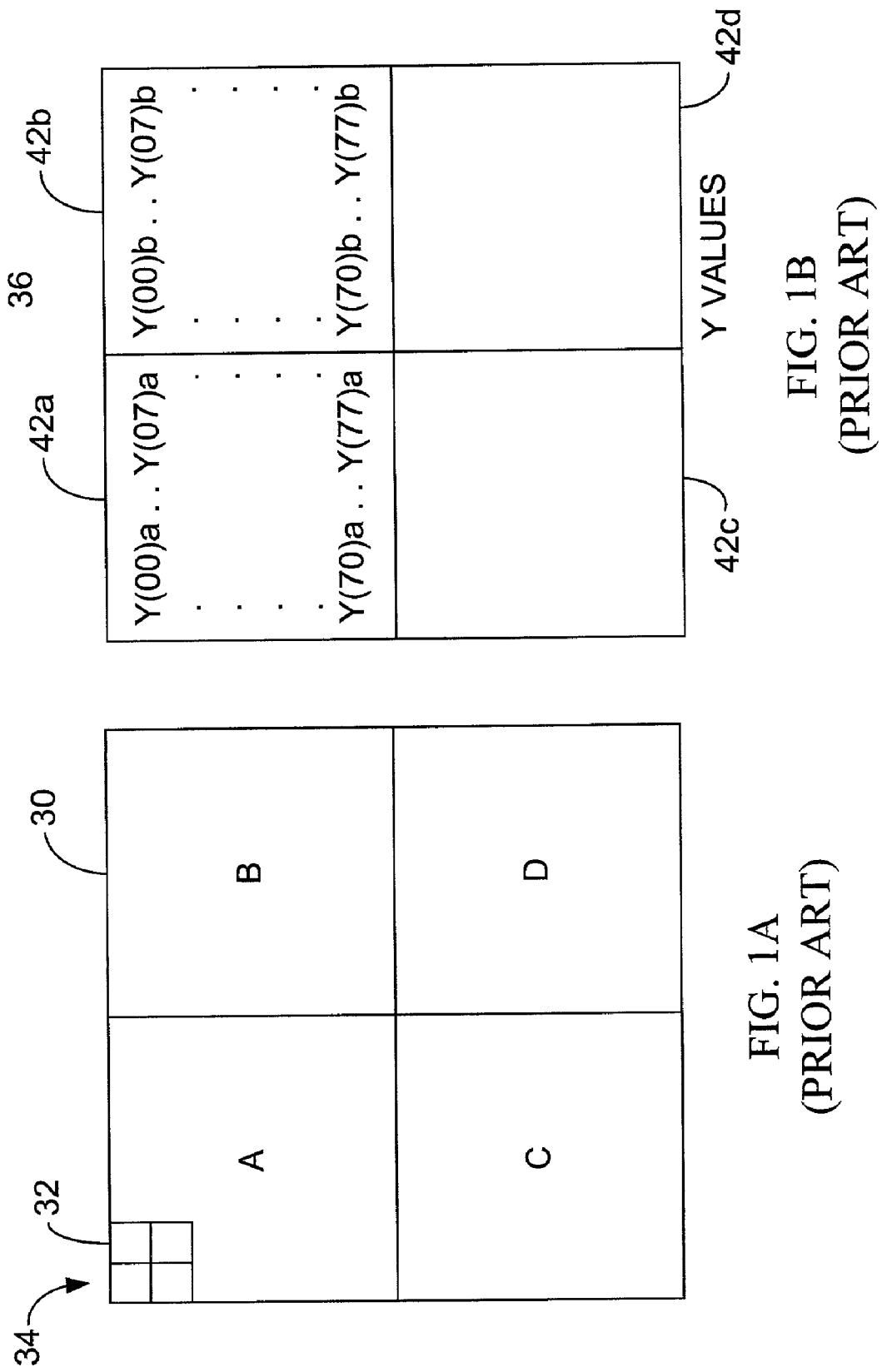
FIG. 1A is a diagram of a conventional macro block of pixels in an image.
FIG. 1B is a diagram of a conventional block of pre-compression luminance values that respectively correspond to the pixels in the macro block of FIG. 1A.
Figures 1C, 1D:
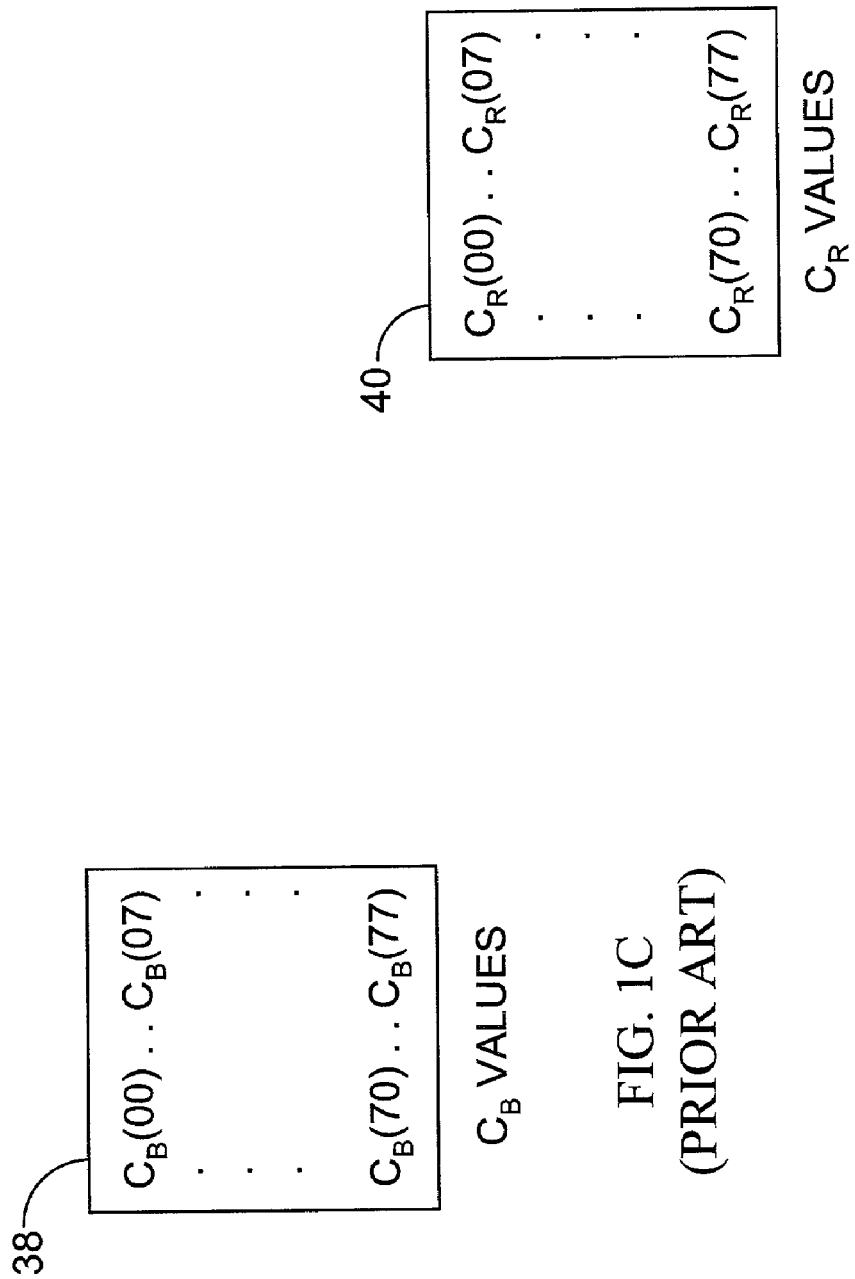
FIGS. 1C and 1D are diagrams of conventional blocks of pre-compression chroma values that respectively correspond to the pixel groups in the macro block of FIG. 1A.
Figure 2:
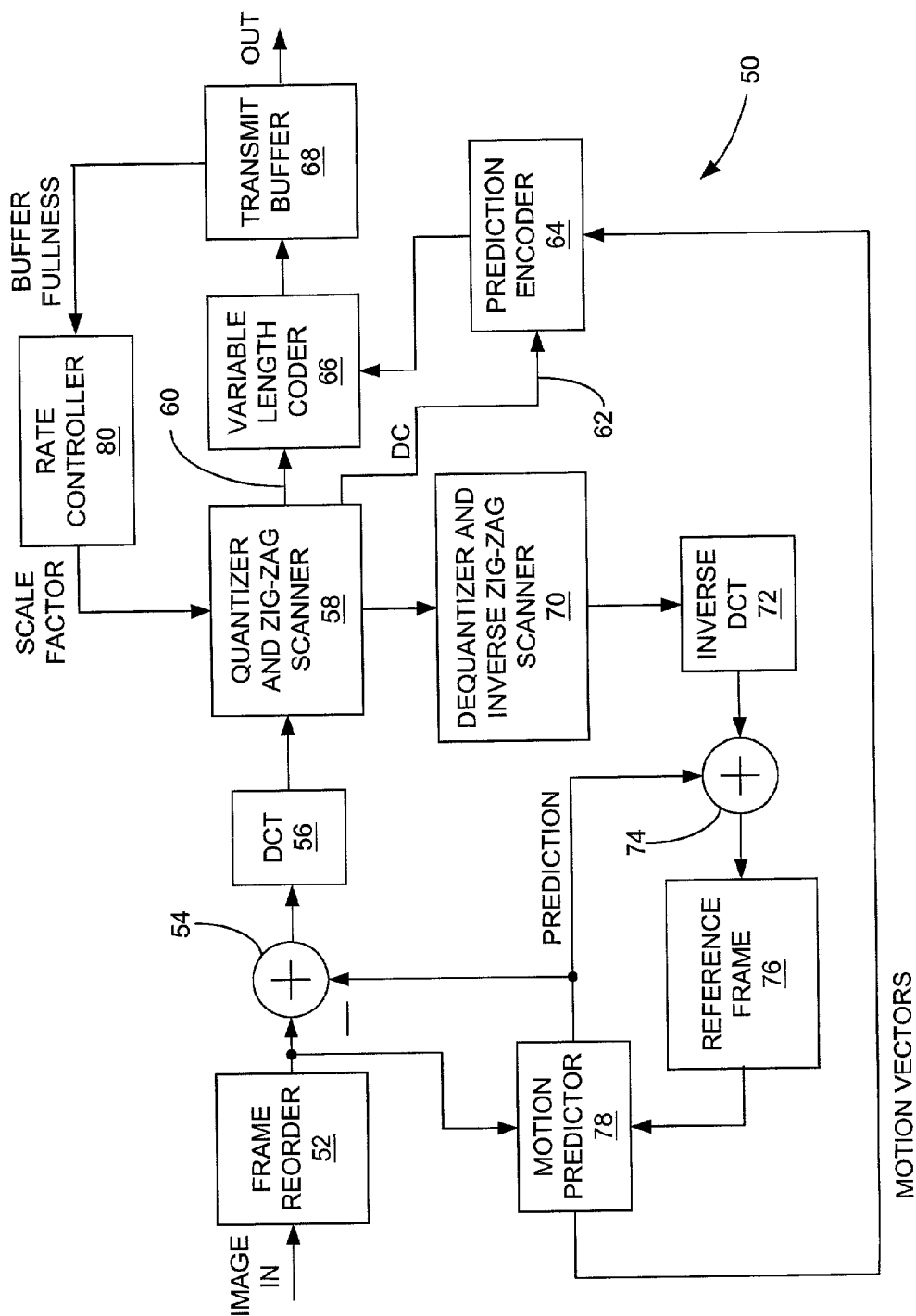
FIG. 2 is a block diagram of a conventional MPEG encoder.
Figure 3:
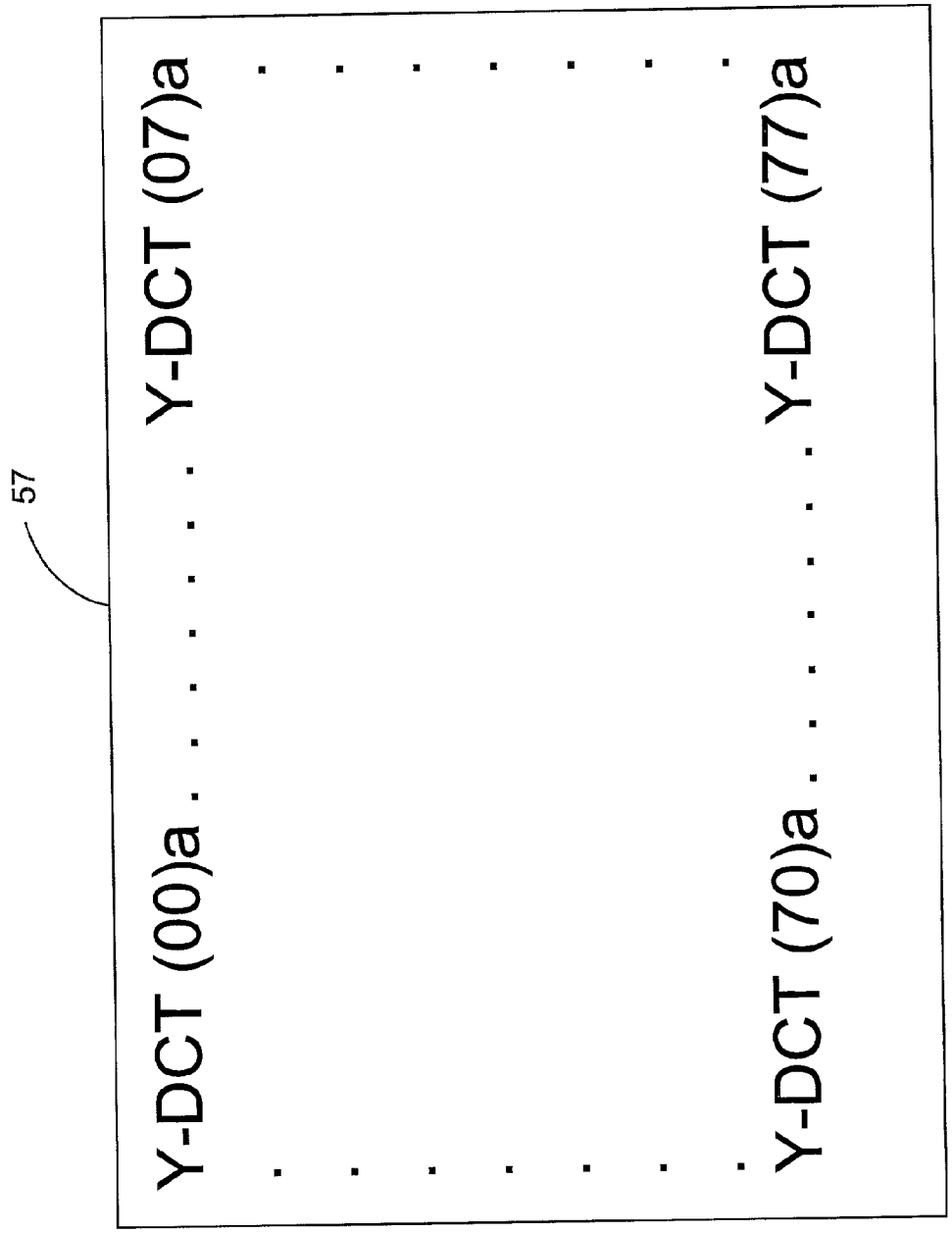
FIG. 3 is a block diagram of luminance transform values that are generated by the encoder of FIG. 2 and that respectively correspond to the pre-compression luminance pixel values of FIG. 1B.
Figure 4:
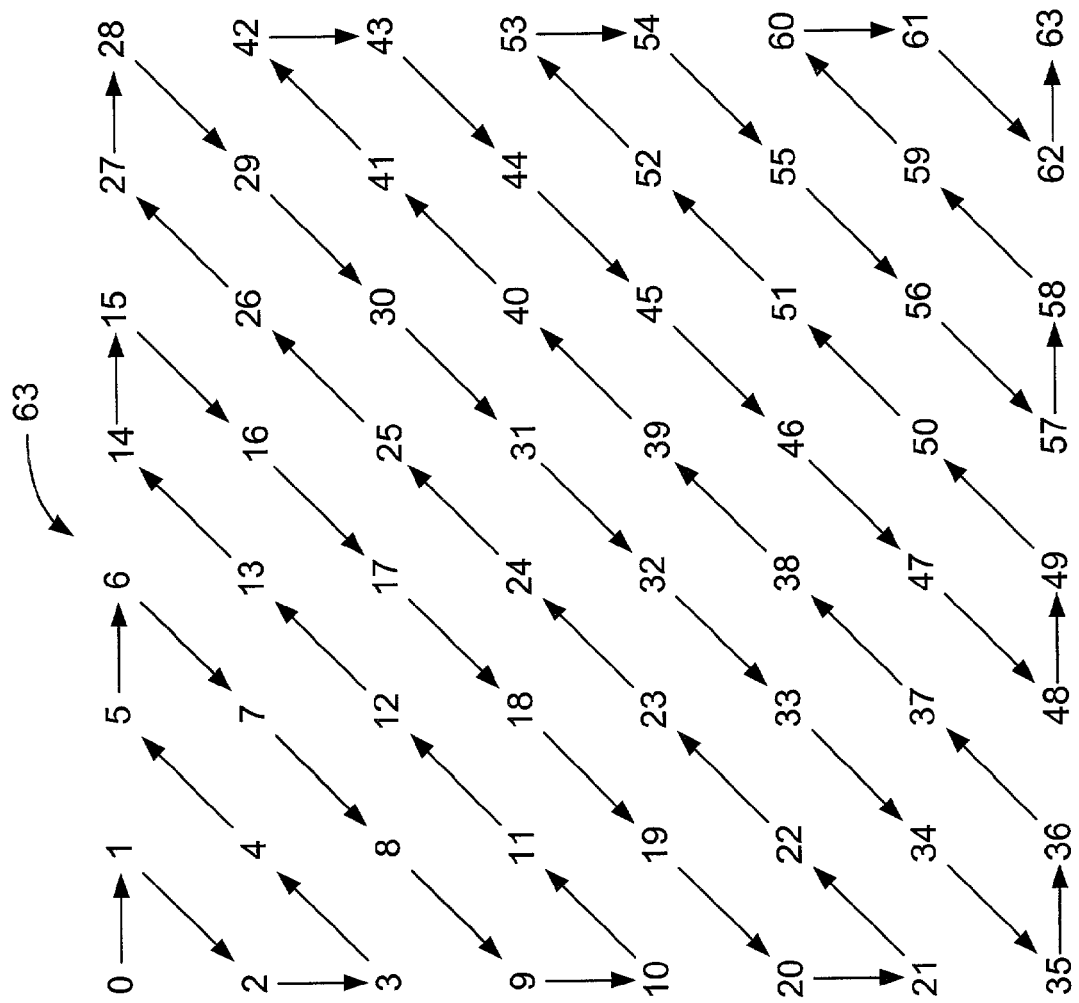
FIG. 4 is a conventional zigzag sampling pattern that can be implemented by the quantizer and zigzag scanner of FIG. 2.
Figure 5:
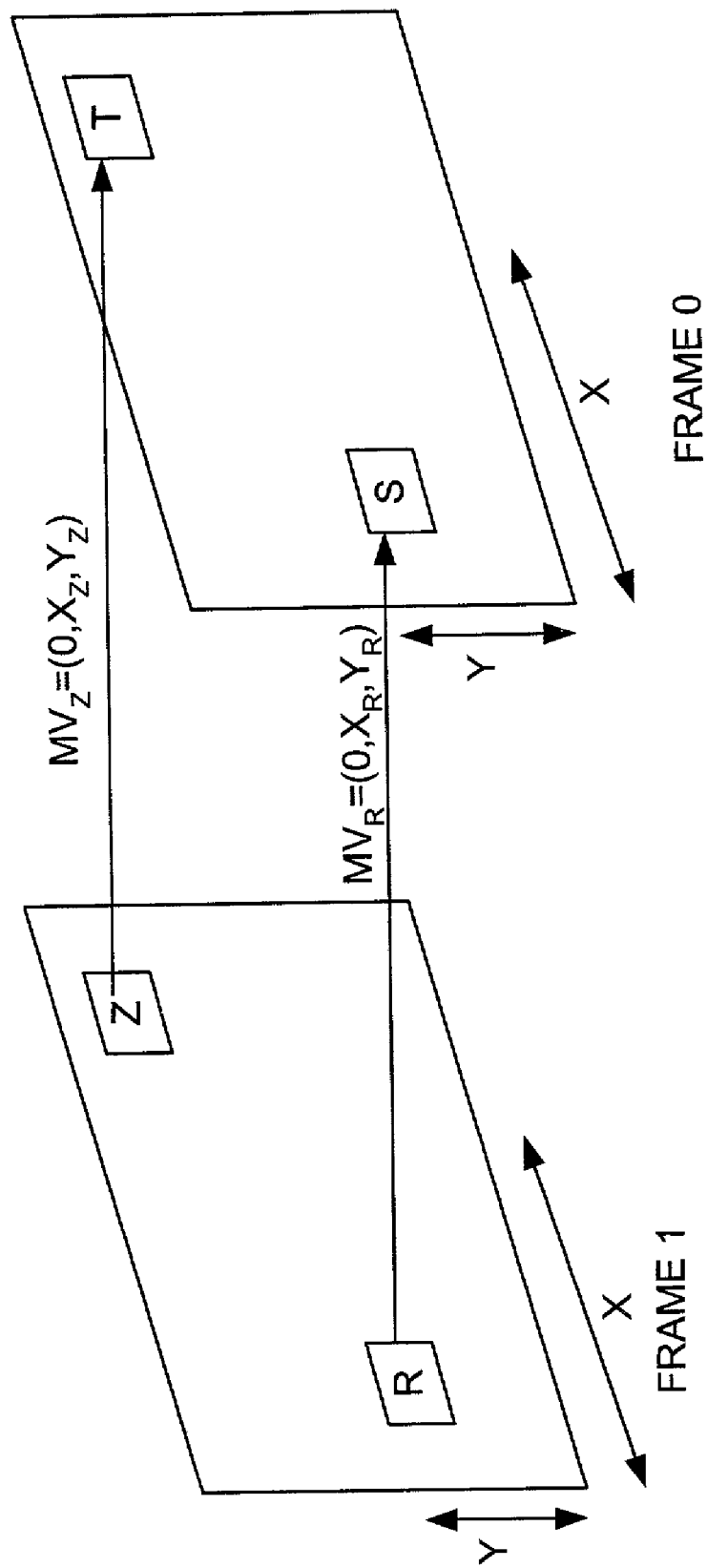
FIG. 5 illustrates the concept of conventional motion vectors.
Figure 6:
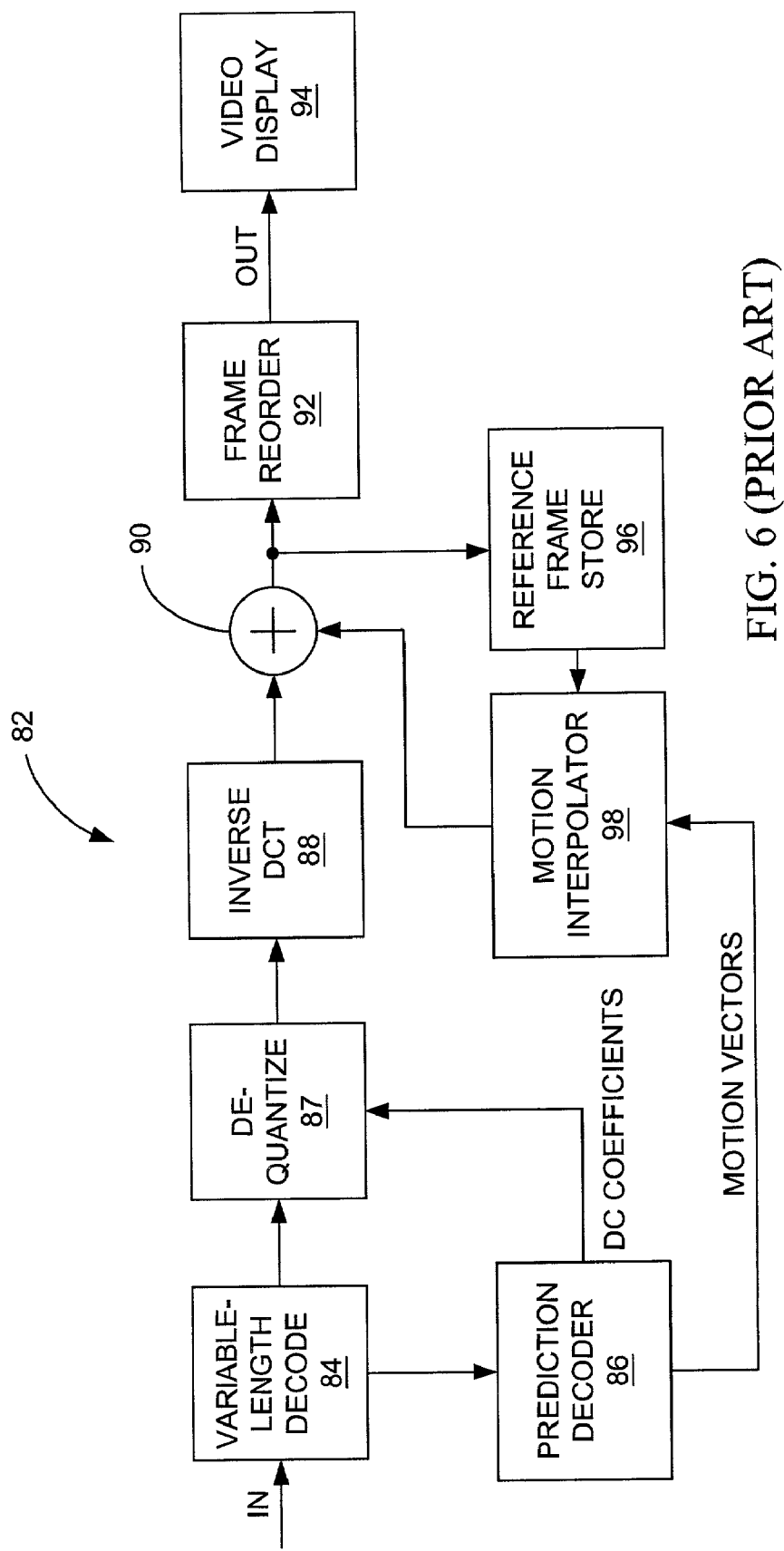
FIG. 6 is a block diagram of a conventional MPEG decoder.
Figure 7:
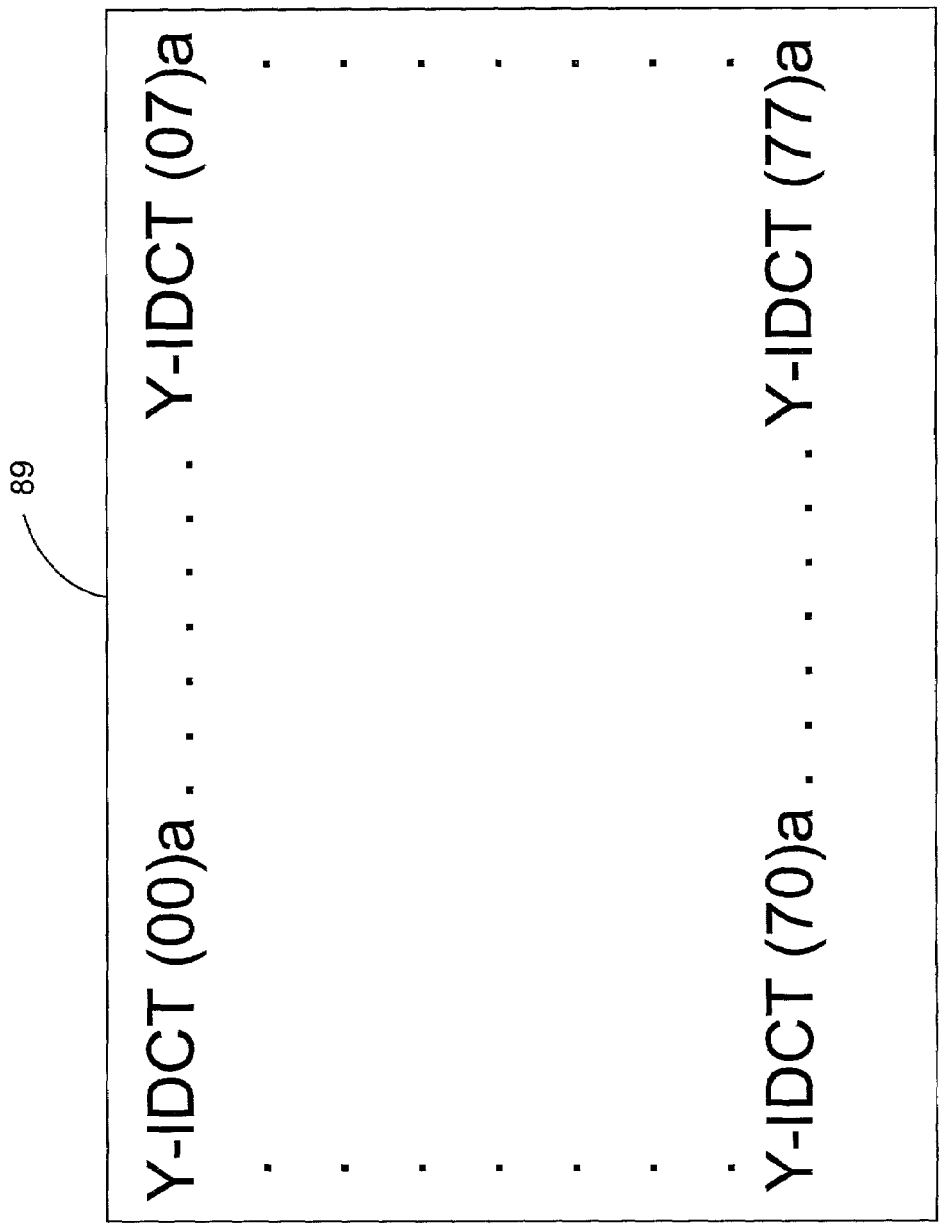
FIG. 7 is a block of inverse transform values that are generated by the decoder of FIG. 6 and that respectively correspond to the luminance transform values of FIG. 3 and the pre-compression luminance pixel values of FIG. 1B.
Figure 8:
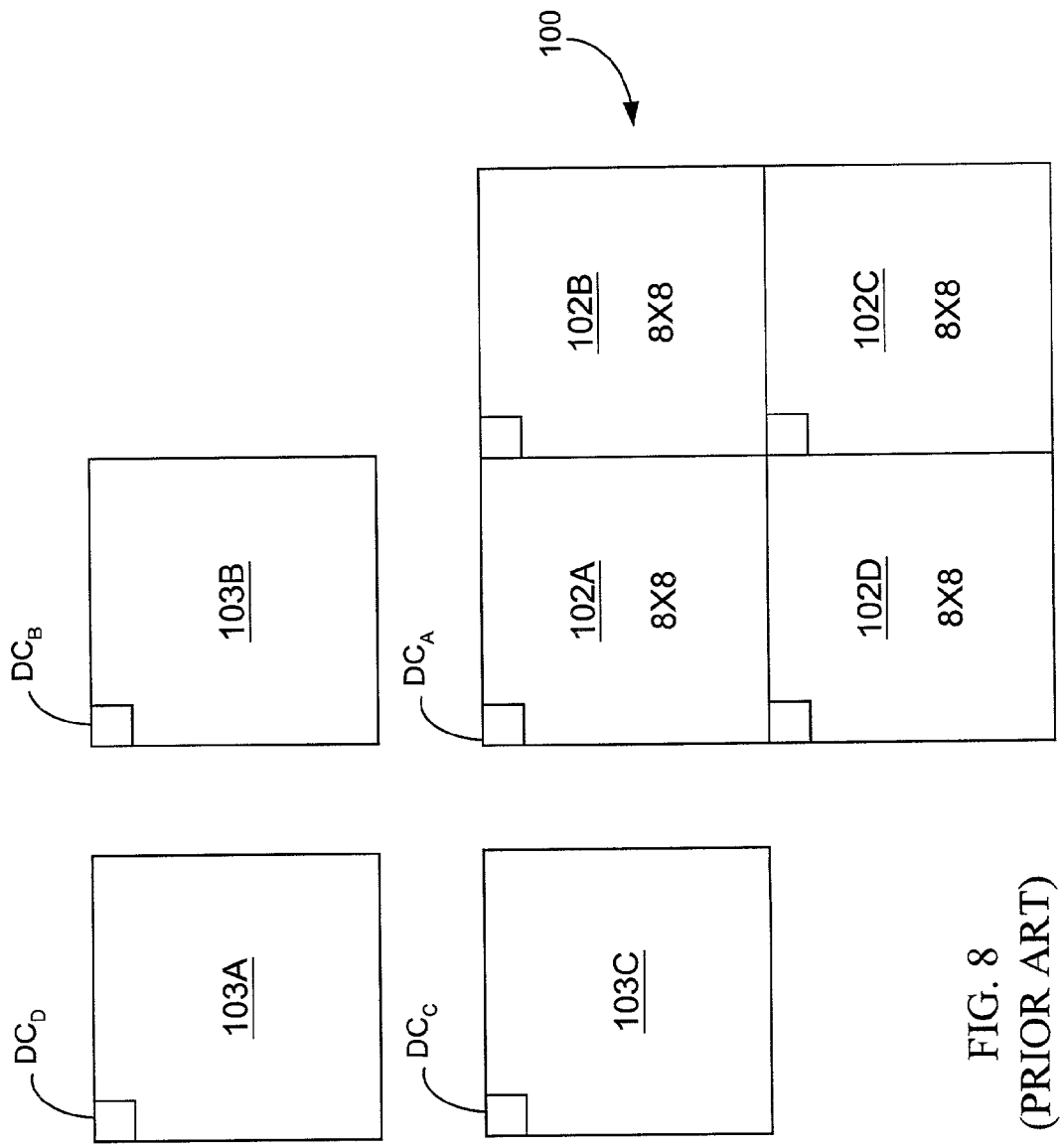
FIG. 8 is a diagram of a macro block showing DC coefficient prediction possibilities.
Figure 9:
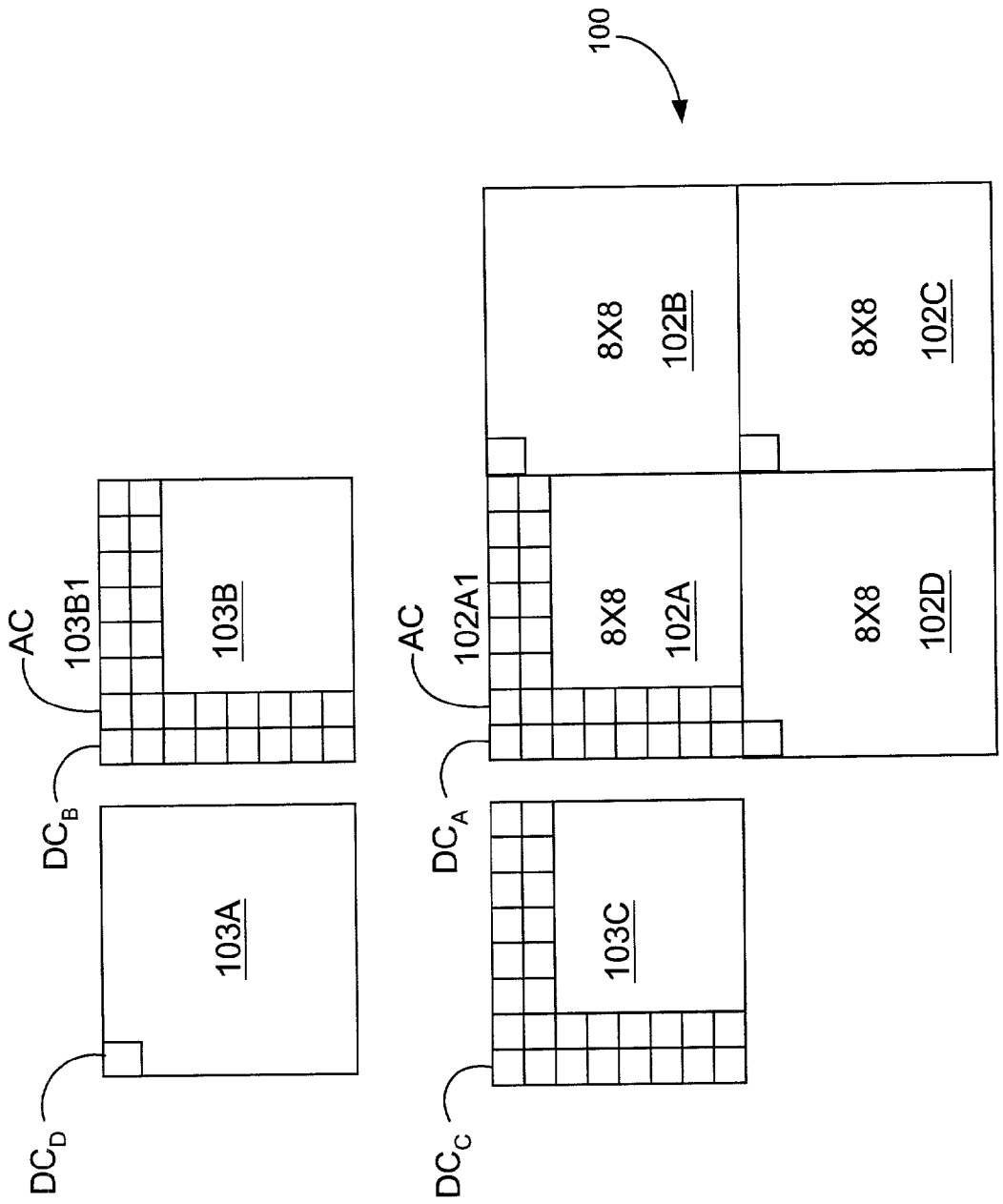
FIG. 9 is a diagram of a macro block showing AC coefficient prediction possibilities.

As discussed above in conjunction with FIG. 8, DC prediction is carried out according to the following equation, which is similar to equation (1) but written with general variables and with the DC-scalar instead of the pointer QP:

$$DC_X = \overline{DC_X} + DC_Y // DC\_scalar_y \quad (5)$$

Figure 10:
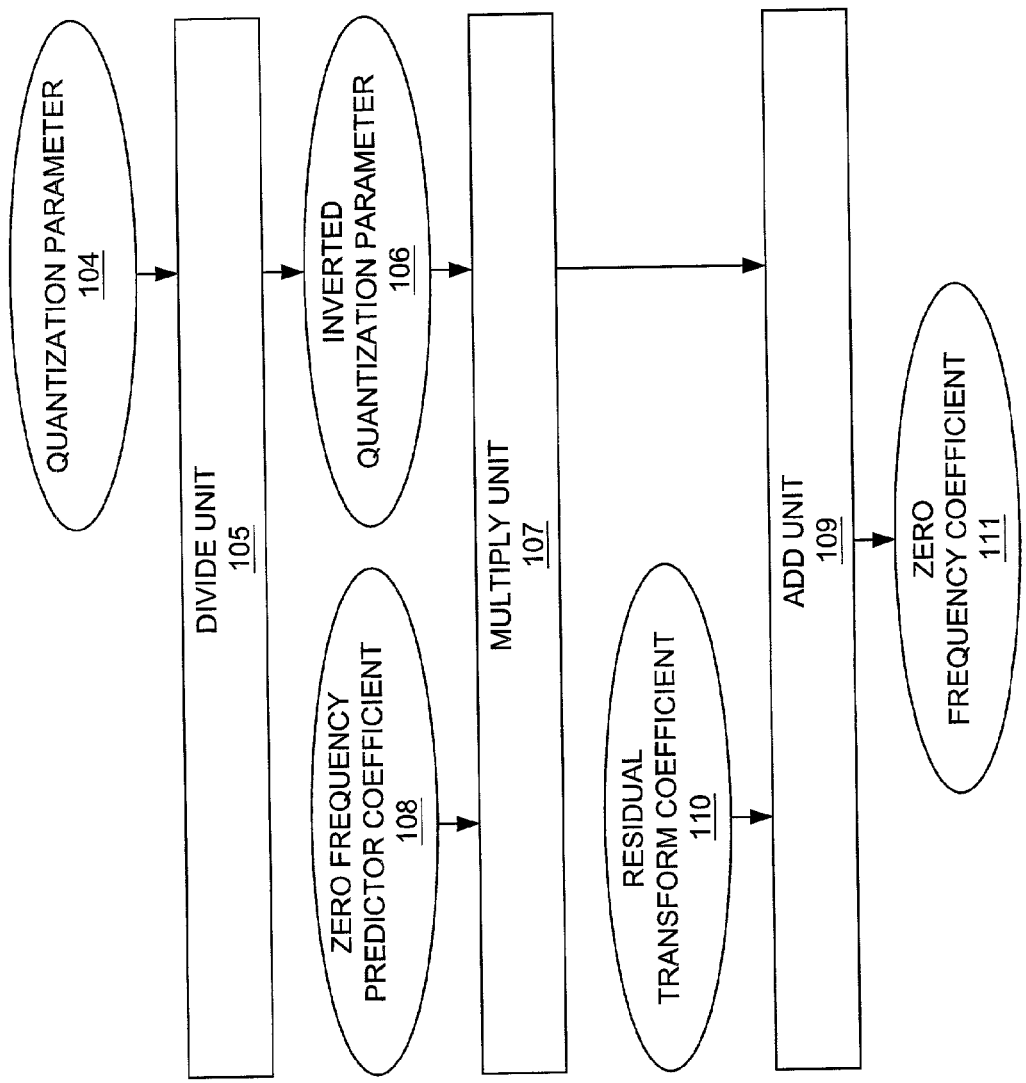
FIG. 10 is a functional unit diagram of the DC prediction algorithm as implemented in MPEG-4.

FIG. 10 is a chart that illustrates the conventional technique for solving equation (1) and/or (5). The scalar value of a quantization parameter 104 for a macro block is inverted by a divide unit 105. The output of the divide unit 105 is an inverted scalar value of a quantization parameter 106 for a macro block calculated using a division rounding results to the nearest integer value. This is multiplied by a multiply unit 107 with the zero-frequency predictor coefficient 108 and the result is added by an add unit 109 to the residual transform coefficient 110 to produce the zero-frequency DC coefficient 111.

Figure 11:
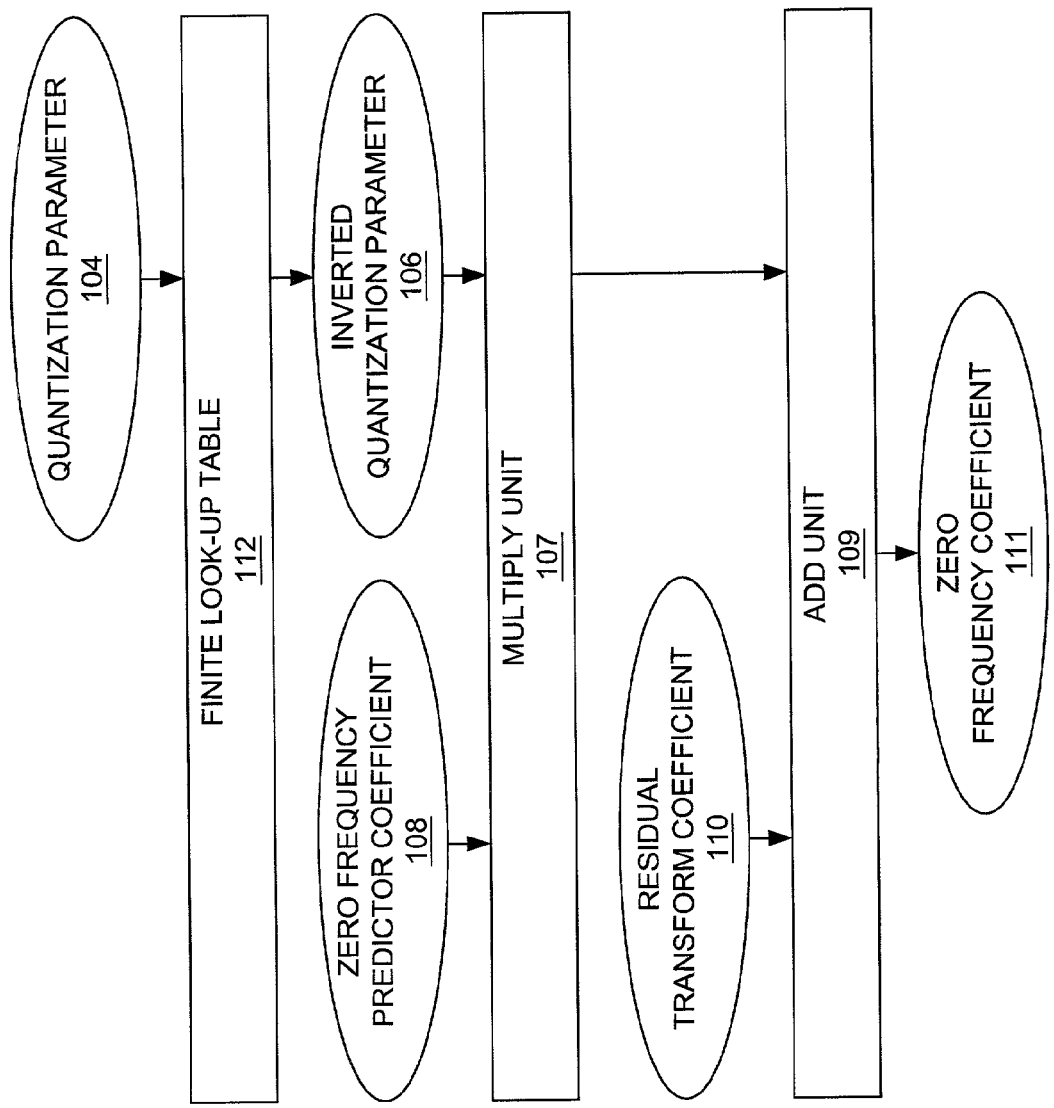
FIG. 11 is a functional unit diagram of the DC prediction algorithm as implemented in MPEG-4 by this invention.

FIG. 11 is a chart that illustrates a technique for solving equation (1) and/or (5) according to an embodiment of the invention. This technique reduces computational complexity and time by eliminating the inter-rounding division // defined by MPEG-4.

Therefore, with reference to equation (5), one first calculates and stores all possible values for $1//DC\_scalar$ so that instead of performing a division each time a DC coefficient is decoded, one obtains the appropriate value for $1//DC\_scalar_y$ from a finite look-up table 112, multiplies this value by $DC_y$, and adds this product to $\overline{DC_x}$ to obtain $DC_x$.

One hurdle to overcome is that MPEG-4 defines the // operation as an exact operation. Therefore, for each possible value of DC_scalar$_y$, one would like to store a single value that is exactly equal to 1//DC_scalar$_y$ for the precision being used.

To do this, the value of DC$_y$//DC_scalar$_y$ must equal to DC$_y$×1//DC_scalar$_y$(as obtained from the look-up table 112) for all values of DC$_y$ and DC-scalar$_y$.

Figure 12:
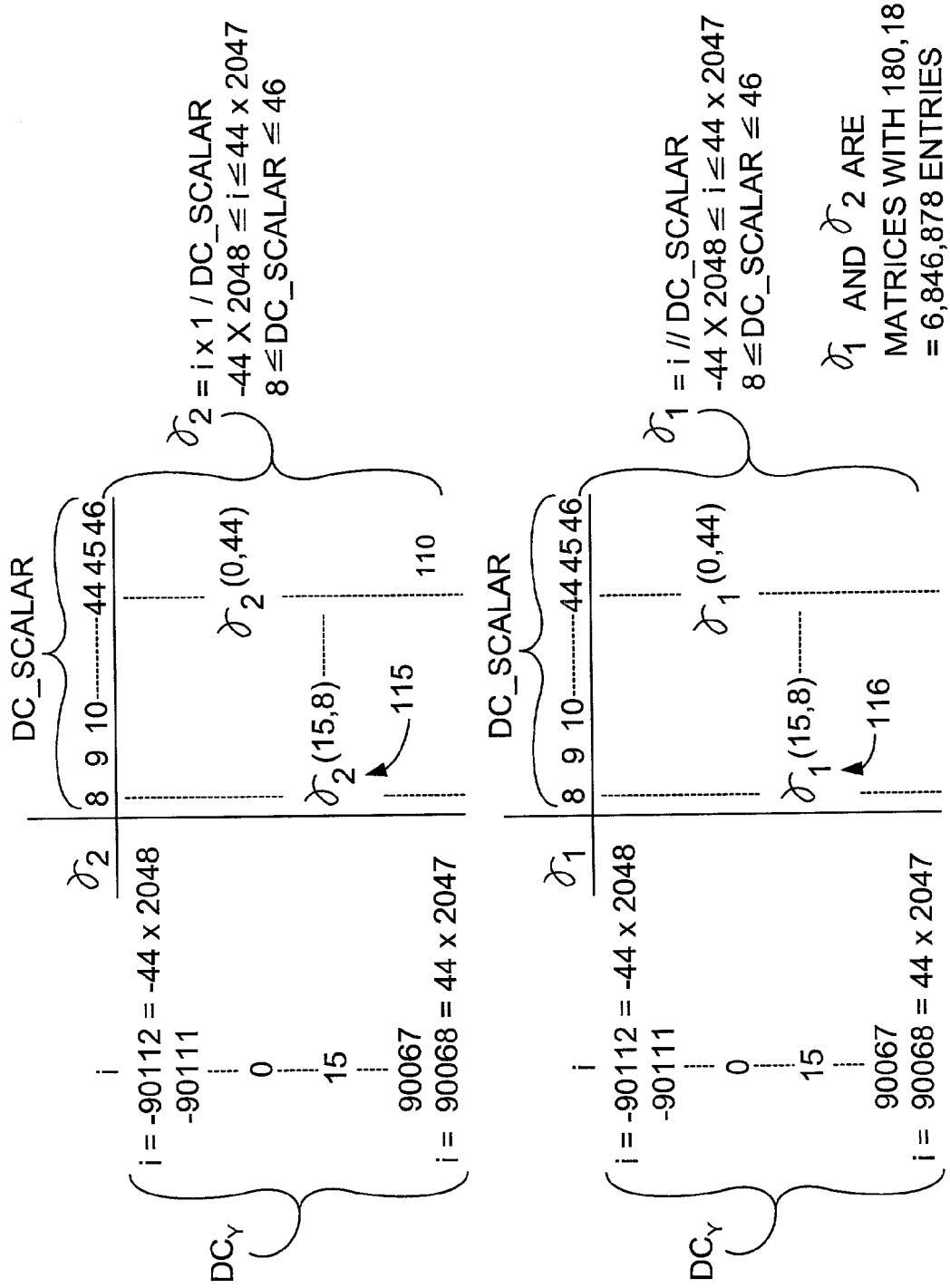
FIG. 12 is a schematic diagram of the matrices used to create the finite look-up table implemented by this invention.

Referring to FIG. 12, the values for DC$_y$ range from −44×2048 to +44×2047. Therefore, one makes a first pass and calculates the table values $\gamma_2$ according to the following equation:

$$\gamma_2 = i \times 1/DC\_scalar \times 2^{-32} \times 2^{32} \quad (6)$$

for i=−44×2048 to +44×2047 and DC_scalar=8 to 46. Note that $\gamma_2$ is a matrix of values. The multiplication by $2^{-32} \times 2^{32}$ rounds $\gamma_2$ to 32-bit precision by shifting the result right and then left to zero the least significant 32 bits.

Next, $\gamma_2$ is compared to $\gamma_1$ which is given by the following equation:

$$\gamma_1 = i // DC\_scalar \quad (7)$$

for i=−44×2048 to +44×2047 and DC_scalar=8 to 46.

If $\gamma_1 = \gamma_2$ for a particular value of DC_scalar and a particular value of i (−44×2048 to +44×2047), then the value stored in the $\gamma_2$ table at these DC-scalar and i coordinates equals $\gamma_2(i) \div i$, which is equivalent to 1//DC_scalar. For example, if $\gamma_1 = \gamma_2$ for i=15 and DC_scalar=8, then the value stored at the table location 115 for i=15 and DC_scalar=8 equals $\gamma_2(15) \div 15$, which is equivalent for 1//DC_scalar 116 for i=15 and DC_scalar=8.

It has been found that for each value of DC_scalar, 1//DC_scalar is the same for most if not all values of i. Therefore, ideally the table would only need to store 39 ((46−8)+1) values of 1//DC_scalar, one for each value of DC_scalar. This is because the quantizer_scale range is from 1 to 31 and so, referring to Table 1, the DC_scalar range is from 8 to 46=(2×quantizer_scale−16)=(2×31−16). When the range of DC_scalar is 8 to 46, the number of possible values of DC-scalar is ((46−8)+1)=39. Unfortunately, because $\gamma_1 \neq \gamma_2$ for some combinations of DC_scalar and i, the table is not ideal, and thus stores more than 39 values, but far fewer than the possible 6,846,878 values.

If $\gamma_1 \neq \gamma_2$ for a particular value of DC_scalar and a particular value of i, then the 1/DC_scalar in equation (3) is altered according to the following equation in order to create a table of only 39 values for 1//DC_scalar:

$$1/DC\_scalar_{modified} = (1/DC\_scalar \times 2^{32} \pm 1) \times 2^{-32} \quad (8)$$

Then, $\gamma_1$ and $\gamma_2$ are recalculated. If $\gamma_1 = \gamma_2$, then the table value of 1//DC_scalar for this particular value of i equals $\gamma_{2recalculated}(i) \div i$. If $\gamma_1 \neq \gamma_2$, then equation (5) is recalculated substituting 1/DC_scalar$_{modified}$ for 1/DC_scalar and $\gamma_1$ and $\gamma_2$ are recalculated. This sequence is repeated until $\gamma_1 = \gamma_2$. At this point, the table has only one unique entry for each value of DC_scalar. It has been found that to obtain the table values for 1//DC_scalar, the maximum value added to 1/DC_scalar value per equation (5) is ±2. Furthermore, the number of times that $\gamma_1 \neq \gamma_2$ and equation (5) is utilized is small. Therefore, this is an effective and efficient technique for calculating table values for 1//DC_scalar.

Still referring to FIG. 12 and as an example, where n=8, the MPEG standard specifies the range of the DCT coefficients, i, by $\lfloor -2^{n+3}, +2^{n+3}-1 \rfloor = [-2048, 2047]$. For a given $r_1 = i \times (1/DC\_scalar)$ where the range of i is [−2048,2047], i is not used to generate the table. The table is made only for the (1/DC_scalar) part to generate the same results as (i//DC_scalar) for all i and a given QP. In this way, when the table is used, $r_2 = i*(1//DC\_scalar) = i*table[DC\_scalar]$. This table is created only once off-line.

Table values could be calculated for all combinations of i and DC_Scalar which would eliminate both divide and multiply in equation (1) but the resulting table may be too large to be practical in some applications.

AC Prediction Without Divide

The technique used to eliminate the divide from the AC prediction equation is similar to the technique used above for the DC equation. Referring to equation (2) above, the general equation for AC prediction is:

$$QF_X[i] = P_{redicted}QF_X[i] + (QF_Y[i] \times QP_Y)//QP_X \quad (9)$$

where QF$_Y$[i] has a range −1024 to +1024, and QP$_Y$ and QP$_X$ are pointers to respective AC step-sized values each having a range from 2–62. This means that a table of (62−2)+1=61 entries is desired. Substituting AC_step-size (abbreviated AC) for QP we get:

$$\gamma_1 = (QF_Y[i] \times AC_Y)//AC_X \quad (10)$$

If we calculate $\gamma_2$ according to equation (6) in a manner similar to the DC-prediction technique, we get:

$$\gamma_2 = (i \times 1/AC_X) \times 2^{-32} \times 2^{32} \quad (11)$$

where i=QF$_Y$[i]×AC$_Y$, and thus has a range from −1024× 62=−63,488 to +63,488, and AC$_Y$ has a range from 2–62. Unfortunately, merely mimicking the DC-prediction technique to calculate $\gamma_2$ generates too many values where $\gamma_1 \neq \gamma_2$.

Therefore, we make a slight modification to the AC-prediction equation (9). Specifically, we multiply equation (9) by 2 to get:

$$2QF_X[i] = 2P_{redicted}QF_X[i] + 2(QF_Y[i] \times QP_Y)//QP_X \quad (12)$$

Therefore:

$$\gamma_1 = 2(QF_Y[i] \times AC_Y)//AC_X \quad (13)$$

and $$\gamma_2 = 2(QF_Y[i] \times AC_Y)/AC_X \times 2^{-32} \times 2^{-32} \quad (14)$$

where 2QF$_Y$[i]×AC$_Y$(equivalent to i of equation (11)) has a range of −2048×62=−126,976 to +126,976.

It has been found that using equations (13) and (14) yields $\gamma_1 = \gamma_2$ for most values of 2QF$_Y$[i] for a particular value of AC$_Y$. As for DC prediction, where $\gamma_1 \neq \gamma_2$, we implement the following equation, which is similar to equation (8), until $\gamma_1 = \gamma_2$:

$$1/AC_{modified} = (1/AC \times 2^{32} \pm 1) \times 2^{-32} \quad (15)$$

Again, it was found that a maximum of ±2 was needed to satisfy $\gamma_1 = \gamma_2$ for all combinations of i and 1/AC.

A table of equivalent values for 1//AC is stored for each value of i. Because equations (12)–(14) are multiplied by 2, then the table values calculated using equation (14) are divided by 2 before they are stored. Also, because for a value of AC the // operation may yield different values for ±i, the table stores a set of values 1//AC for positive values of i and a separate set of values for negative values of i. The total table length is 2×61=122.

It is to be understood that even though various embodiments and advantages of the present invention have been set forth in the foregoing description, the above disclosure is illustrative only, and changes may be made in detail, and yet remain within the broad principles of the invention. Therefore, the present invention is to be limited only by the appended claims.

What is claimed:

1. A processing circuit comprising:
    a storage circuit operable to store a lookup table; and
    a processor operable to:
        calculate all possible values for an inverted variable in the equation for decoding predicted non zero frequency transform coefficients; and
        store all said values in said lookup table.

2. The processing circuit of claim 1 wherein:
    calculating all possible values comprises calculating the equivalence of all possible values for an inverted scalar value of a quantization parameter for a macro block calculated using a division rounding results to the nearest integer value; and
    storing all said values in a lookup table comprises storing a value exactly equal to the inverse of the scalar value of a quantization parameter for a macro block for the precision being used.

3. The processing circuit of claim 1 wherein calculating all possible values comprises calculating for each possible value of the scalar value of a quantization parameter for a macro block a value exactly equal to the inverse of the scalar value of a quantization parameter for a macro block for the precision being used.

4. The processing circuit of claim 1 wherein calculating all possible values comprises calculating the zero frequency coefficient of a macro block used for prediction purposes times the inverted variable in the equation for decoding predicted non zero frequency transform coefficients for all values of the non zero frequency coefficient of a macro block used for prediction purposes and all values of the sealar value of a quantization parameter for a macro block.

5. The processing circuit of claim 1 wherein:
    calculating all possible values comprises calculating the one hundred and twenty-two possible values for the inverted scalar value of a quantization parameter for a macro block; and
    storing all said values in a lookup table comprises storing a value exactly equal to the inverse of the scalar value of the quantization parameter for a macro block for the precision being used.

6. A processing circuit comprising:
    a storage circuit operable to store a lookup table of all one hundred and twenty-two possible values for the inverted scalar value of a quantization parameter for a macro block; and
    a processor operable to calculate the non-zero-frequency coefficient for a macro block using a said table to avoid using a division rounding results to the nearest integer value.

7. A processing circuit comprising:
    a storage circuit operable to store a lookup table of all one hundred and twenty-two values of the inverted scalar value of a quantization parameter for a macro block calculated off-line; and
    a processor operable to calculate the non-zero-frequency coefficients for any number of macro blocks being decoded without using the divide unit of said processor by repeatedly using said stored look up table.

8. A processing circuit comprising:
    a storage circuit operable to store a lookup table; and
    a processor operable to receive encoded images, each in a standard format, and to decode said received encoded bit stream using said lookup table wherein a divide unit of the processor is not used when decoding predicted non-zero-frequency transform coefficients.

9. A method comprising:
    generating a lookup table of one hundred and twenty-two values of an inverted scalar value of a quantization parameter for a macro block; and
    calculating the non-zero-frequency coefficient for a macro block using said table to avoid using rounding division.

10. The method of claim 9 wherein generating the look-up table comprises calculating the one hundred twenty-two values of the inverted scalar value of a quantization parameter off-line.

11. A method comprising:
    storing a lookup table of one hundred and twenty-two values of an inverted scalar value of a quantization parameter for a macro block; and
    decoding a received encoded-image bit stream with said lookup table wherein a division operation is not used when decoding predicted non-zero-frequency transform coefficients.

12. A method comprising:
    receiving encoded images, each in a standard format; and
    decoding predicted non-zero-frequency transform coefficients using values from a look-up table and without division.

13. The method of claim 12 wherein decoding comprises:
    getting the appropriate value for the inverse scalar value of a quantization parameter for a macro block from the look-up table;
    multiplying this value by the non-zero-frequency-coefficient of a macro block used for prediction purposes; and adding this product to the decoded-but-not-inverse-quantized residual zero frequency transform coefficient value to get the non-zero-frequency-coefficient of the macro block being predicted.

* * * * *